(12) United States Patent
Chern et al.

(10) Patent No.: US 11,610,893 B2
(45) Date of Patent: Mar. 21, 2023

(54) METHOD FOR FABRICATING SEMICONDUCTOR MEMORY DEVICE WITH BURIED CAPACITOR AND FIN-LIKE ELECTRODES

(71) Applicant: HeFeChip Corporation Limited, Sai Ying Pun (HK)

(72) Inventors: Geeng-Chuan Chern, Cupertino, CA (US); Liang-Choo Hsia, Hsinchu (TW)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 17/676,780

(22) Filed: Feb. 21, 2022

(65) Prior Publication Data

US 2022/0181328 A1    Jun. 9, 2022

Related U.S. Application Data

(62) Division of application No. 16/712,962, filed on Dec. 12, 2019, now Pat. No. 11,296,090.

(51) Int. Cl.
   *H01L 27/108*   (2006.01)
   *G11C 11/401*   (2006.01)
(52) U.S. Cl.
   CPC ...... *H01L 27/10832* (2013.01); *G11C 11/401* (2013.01); *H01L 27/10861* (2013.01)
(58) Field of Classification Search
   CPC ............. G11C 11/401; H01L 27/10832; H01L 27/10858; H01L 27/10861
   USPC .................................................. 438/244, 387
   See application file for complete search history.

(56) References Cited

U.S. PATENT DOCUMENTS

| | | | |
|---|---|---|---|
| 5,290,726 A | 3/1994 | Kim | |
| 5,892,256 A * | 4/1999 | Matsushita | ......... H01L 27/1082 257/E21.651 |
| 5,903,024 A | 5/1999 | Hsu | |
| 6,008,515 A | 12/1999 | Hsia | |
| 7,276,751 B2 | 10/2007 | Ho | |
| 7,682,896 B2 | 3/2010 | Ho | |
| 2003/0042519 A1 | 3/2003 | Tzeng | |
| 2009/0236691 A1 | 9/2009 | Dyer | |
| 2011/0073994 A1 | 5/2011 | Liu | |
| 2017/0358581 A1 | 12/2017 | Cartier | |

* cited by examiner

*Primary Examiner* — Hoai V Pham
(74) *Attorney, Agent, or Firm* — Winston Hsu

(57) ABSTRACT

A method for forming a semiconductor device is disclosed. A substrate having a semiconductor substrate, an insulator layer on the semiconductor substrate, and a silicon device layer on the insulator layer is provided. At least one capacitor cavity with corrugated sidewall surface is formed within the insulator layer between the semiconductor substrate and the silicon device layer. At least one buried capacitor is formed in the at least one capacitor cavity. The at least one buried capacitor comprises inner and outer electrodes with a capacitor dielectric layer therebetween. At least one transistor is formed on the substrate. The at least one transistor comprises a source region, a drain region, a channel region between the source region and the drain region, and a gate over the channel region. The source region is electrically connected to the inner electrode of the at least one buried capacitor.

7 Claims, 11 Drawing Sheets

METHOD FOR FABRICATING SEMICONDUCTOR MEMORY DEVICE WITH BURIED CAPACITOR AND FIN-LIKE ELECTRODES

CROSS REFERENCE TO RELATED APPLICATIONS

This application is a division of U.S. application Ser. No. 16/712,962, filed on Dec. 12, 2019. The content of the application is incorporated herein by reference.

BACKGROUND OF THE INVENTION

1. Field of the Invention

The present disclosure relates generally to the field of semiconductor technology. More particularly, the present disclosure relates to a semiconductor memory device with shallow buried capacitor and a method for fabricating the same.

2. Description of the Prior Art

Dynamic random access memories (DRAMs) are employed in devices such as processors and application specific integrated circuits (ASICs).

A DRAM cell typically comprises a transistor and a trench or stacked capacitor. The stacked capacitor is formed after transistor formation. Thus the process steps and heat cycles required to form stacked capacitor have significant impacts on the transistor performance. This is a disadvantage for embedded applications. The trench capacitor is formed prior to transistor formation and, therefore, has no impact on the transistor performance, resulting in big advantages for embedded applications.

The trench capacitor is a three dimensional device formed by etching a deep trench into a semiconductor substrate. A capacitor dielectric layer is formed on the inner walls of the deep trench. The deep trench is then filled with an electrically conductive material such as heavily-doped polysilicon, which functions as one electrode of the deep trench capacitor while an N-type doped region surrounding the lower portion of the deep trench functions as the second electrode thereof. A transistor can then be formed above and in electrical communication with the trench capacitor.

It is desirable to improve the capacitance per unit area for compensating area loss due to dimension reduction of unit DRAM cells. Current approach to the improvement on the capacitance per unit area for the trench capacitor is to increase the trench depth. However, as the geometry becomes smaller, increasing the trench depth (to several μm deep) has great difficulties for trench formation, as well as capacitor dielectric and inner electrode formation, due to high aspect ratio. Besides, deep trenches lead to increase of serial resistance and thus, increased charging time.

Therefore, there is a need in this technical field to provide an improved semiconductor memory device having a buried capacitor with increased capacitor surface area without the need to form the deep trench capacitor for DRAMs.

SUMMARY OF THE INVENTION

It is one objective of the present disclosure to provide a structure, as well as method of fabricating same, of a shallow buried capacitor with increased capacitor surface area and high capacitance value without the need to form deep trenches for DRAMs.

One aspect of the present disclosure provides a semiconductor device includes a substrate having a semiconductor substrate, an insulator layer on the semiconductor substrate, and a silicon device layer on the insulator layer. At least one capacitor cavity with corrugated sidewall surface is disposed within the insulator layer between the semiconductor substrate and the silicon device layer. At least one buried capacitor is provided in the at least one capacitor cavity. The at least one buried capacitor includes an inner electrode and an outer electrode with a capacitor dielectric layer therebetween. At least one transistor is disposed on the silicon device layer. The at least one transistor comprises a source region, a drain region, a channel region between the source region and the drain region, and a gate over the channel region. The source region is electrically connected to the inner electrode of the at least one buried capacitor.

According to some embodiments, the insulator layer comprises alternating insulating layers.

According to some embodiments, the alternating insulating layers comprise alternating silicon oxide layers and silicon nitride layers.

According to some embodiments, each of the silicon oxide layers has a thickness of about 2-20 nm and each of the silicon nitride layers has a thickness of about 2-20 nm.

According to some embodiments, the at least one capacitor cavity comprises recesses in the silicon oxide layers, respectively.

According to some embodiments, the inner electrode layer comprises fin-like electrodes laterally extending into the recesses, respectively.

According to some embodiments, the at least one capacitor cavity has a depth ranging between 200 and 1000 nm.

According to some embodiments, the outer electrode of the at least one buried capacitor comprises an N-type polysilicon with rugged surface.

According to some embodiments, the semiconductor device further comprises an $N^+$ doped region disposed in an upper surface of the semiconductor substrate within the capacitor cavity. The $N^+$ doped region is in direct contact with the outer electrode.

According to some embodiments, the semiconductor device further comprises a conductive material layer embedded within an upper portion of the capacitor cavity, wherein the inner electrode is in direct contact with the conductive material layer.

According to some embodiments, the source region is electrically connected to the conductive material layer.

According to some embodiments, the semiconductor device further comprises a silicide layer on said source region, said drain region, said gate, and said conductive material layer.

According to some embodiments, the drain region of the transistor is connected to a bitline.

Another aspect of the invention provides a method for forming a semiconductor device. A substrate having a semiconductor substrate, an insulator layer on the semiconductor substrate, and a silicon device layer on the insulator layer is provided. At least one capacitor cavity with corrugated sidewall surface is formed within the insulator layer between the semiconductor substrate and the silicon device layer. At least one buried capacitor is formed in the at least one capacitor cavity. The at least one buried capacitor comprises inner and outer electrodes with a capacitor dielectric layer therebetween. At least one transistor is formed on the substrate. The at least one transistor comprises a source region, a drain region, a channel region between the source region and the drain region, and a gate over the channel region. The source region is electrically connected to the inner electrode of the at least one buried capacitor.

According to some embodiments, the method further comprises: forming alternating layers in the substrate to form the insulator layer.

According to some embodiments, the alternating layers comprise alternating silicon oxide layers and silicon nitride layers.

According to some embodiments, each of the silicon oxide layers has a thickness of about 2-20 nm and each of the silicon nitride layers has a thickness of about 2-20 nm.

According to some embodiments, the method further comprises: forming recesses in the silicon oxide layers.

According to some embodiments, the inner electrode comprises fin-like electrodes laterally extending into the recesses, respectively.

According to some embodiments, the at least one capacitor cavity has a depth ranging between 200 and 1000 nm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
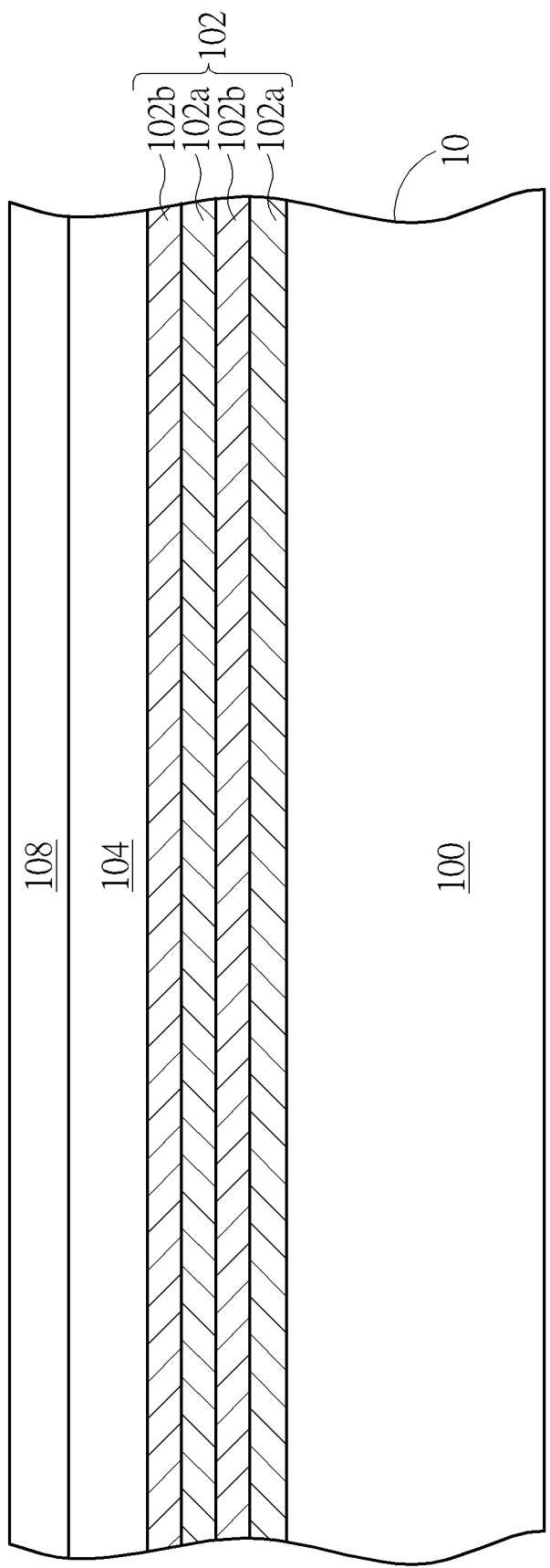
FIG. 1 to FIG. 11 are cross-sectional diagrams showing a method for fabricating a semiconductor device with a buried capacitor according to one embodiment of the present disclosure.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to a shallow buried capacitor and a semiconductor device such as a semiconductor memory device having such buried capacitor, which is particularly suited for DRAM applications. The semiconductor device includes a substrate comprising a shallow capacitor cavity with corrugated sidewall surface. A buried capacitor is formed in the shallow capacitor cavity. The buried capacitor may comprise inner and outer electrodes with a node dielectric layer therebetween. A transistor is provided on the substrate. The transistor comprises a source region and a drain region, a channel region between the source region and the drain region, and a gate over the channel region. The source region may be electrically connected to the inner electrode of the shallow buried capacitor. The drain region of the transistor may be electrically connected to a bitline.

The substrate may comprise a semiconductor-on-insulator (SOI) structure. According to some embodiments, the substrate may comprise alternating layers. For example, the alternating layers may comprise alternating silicon nitride layers and silicon oxide layers. Recesses may be formed in the silicon oxide layers, thereby forming the corrugated sidewall surface.

FIG. 1 to FIG. 11 are cross-sectional diagrams showing a method for fabricating a semiconductor device with a shallow buried capacitor according to one embodiment of the present disclosure. As shown in FIG. 1, a substrate 10 is provided. According to one embodiment, the substrate 10 may comprise a silicon-on-insulator (SOI) structure comprising, for example, a semiconductor substrate (or a semiconductor layer) 100, an insulator layer 102 on the semiconductor substrate 100, and a silicon device layer 104 on the insulator layer 102. According to one embodiment, for example, the semiconductor substrate 100 may comprise a doped silicon substrate or other semiconductor materials. For example, the semiconductor substrate 100 may an N-type silicon substrate or an $N^+$-type on top of P-type silicon substrate, but not limited thereto. According to one embodiment, for example, the semiconductor substrate 100 may be an N-type doped silicon substrate, and the silicon device layer 104 may be a P-type silicon layer. According to one embodiment, for example, the silicon device layer 104 may have a thickness of about 50-500 nm, the insulator layer 102 may have a thickness of about 300-1000 nm, and the semiconductor substrate 100 may be 50-500 micrometers, but not limited thereto.

According to one embodiment, for example, the insulator layer 102 comprises alternating insulating layers. According to one embodiment, for example, the insulator layer 102 may comprise, for example, alternating silicon oxide layers 102a and silicon nitride layers 102b. According to one embodiment, for example, the aforesaid alternating layers may be formed by a repeated alternation of film deposition on the semiconductor substrate 100.

According to one embodiment, for example, each of the silicon oxide layers 102a may have a thickness of about 2-20 nm and each of the silicon nitride layers 102b may have a thickness of about 2-20 nm. It is not necessary that the silicon oxide layers 102a and the silicon nitride layers 102b have the same thickness. Preferably, the silicon oxide layer 102a has a thickness that is thicker than the silicon nitride layer 102b. It is to be understood that there may be multiple pairs of silicon oxide layer 102a and silicon nitride layer 102b, for example, hundreds of silicon oxide/silicon nitride layer pairs. For the sake of simplicity, only two pairs of alternating silicon oxide layer 102a and silicon nitride layer 102b are illustrated.

According to one embodiment, a silicon nitride layer 108 is deposited on the silicon device layer 104 in a blanket manner. According to one embodiment, for example, the silicon nitride layer 108 may have a thickness of about 100-300 nm. The silicon nitride layer 108 may be deposited by chemical vapor deposition (CVD) methods.

Figure 2:
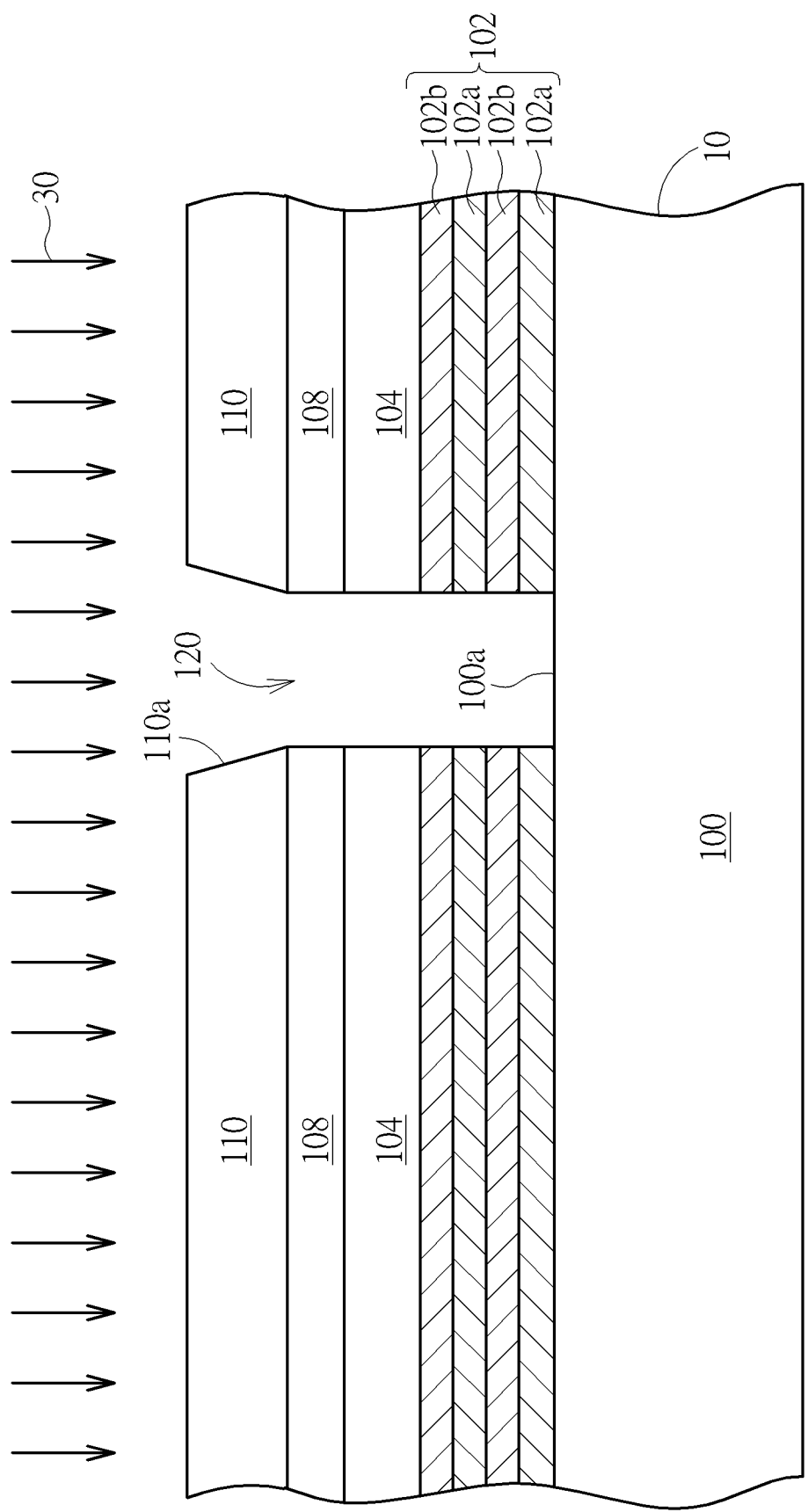

As shown in FIG. 2, a lithographic process may be performed to form a patterned photoresist layer 110 on the silicon nitride layer 108. The patterned photoresist layer 110 comprises an opening 110a that define a capacitor forming area, in which a shallow buried capacitor is to be formed. Subsequently, an anisotropic dry etching process 30 may be performed to etch the silicon nitride layer 108, the silicon device layer 104, and the insulator layer 102 through the opening 110a, thereby forming a shallow capacitor cavity 120 extending through the silicon nitride layer 108, the silicon device layer 104, and the insulator layer 102. According to one embodiment, for example, the capacitor cavity 120 partially exposes an upper surface 100a of the semiconductor substrate 100. It is to be understood that when viewed from the above, the shape of the shallow capacitor cavity 120 may comprise a circular shape, an oval shape, or a rectangular shape, but not limited thereto. It is to be understood that a plurality of shallow capacitor cavities arranged in an array may be formed in the substrate 10 although only one shallow capacitor cavity 120 is illustrated in the figures. According to one embodiment, for example, the shallow capacitor cavity 120 may have a depth ranging between 200 and 1000 nm.

Figure 3:
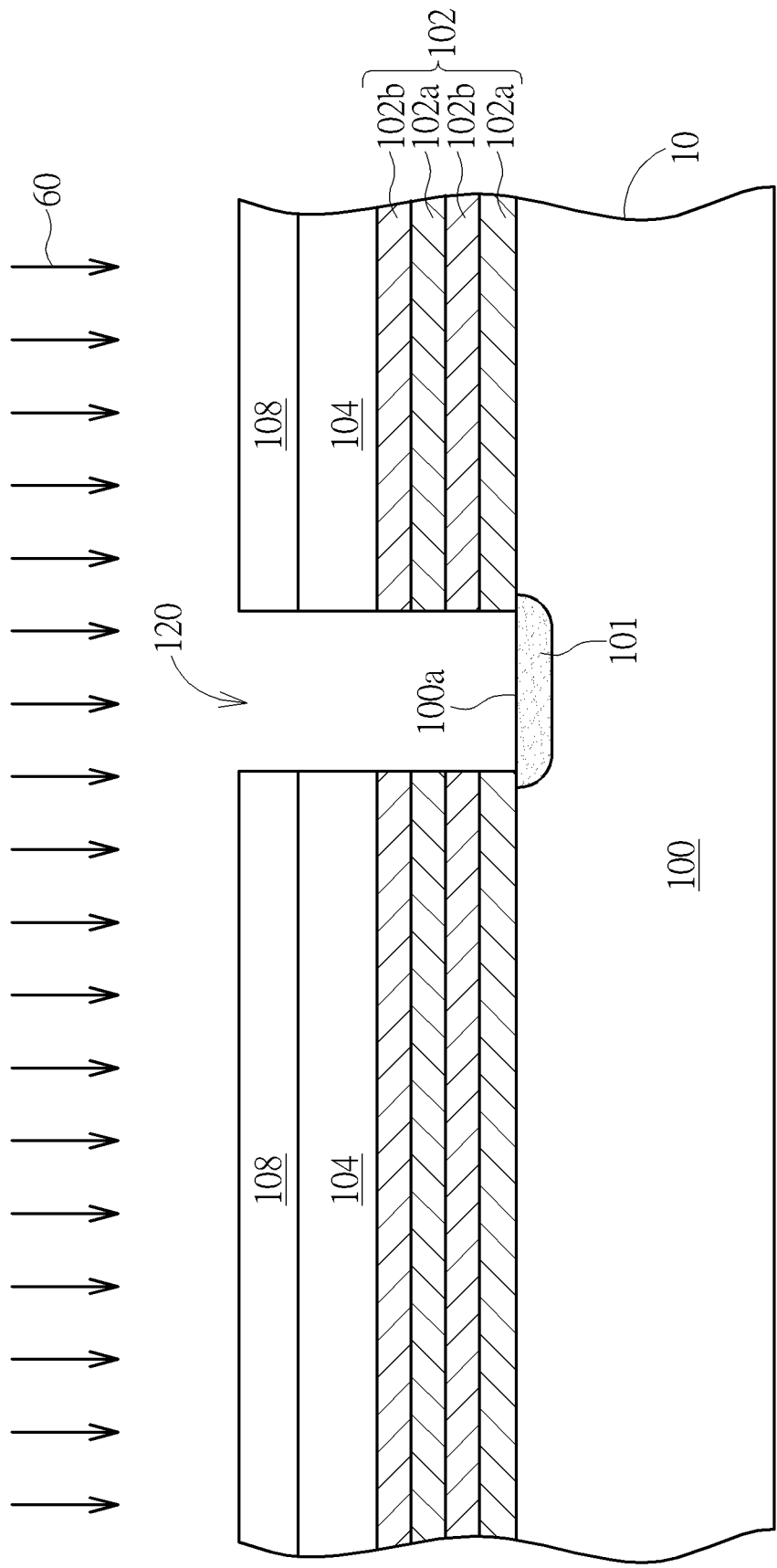

As shown in FIG. 3, after stripping the patterned photoresist layer 110, an optional ion implantation process 60 may be performed to implant N-type dopants such as arsenic (As) or phosphorus (P) into the exposed portion of the upper surface 100a of the semiconductor substrate 100 within the shallow capacitor cavity 120 in a self-aligned manner, thereby forming an $N^+$ doped region 101. According to one embodiment, for example, the ion implantation process 60 may be performed at a dose of about 1E15-5E15 atoms/cm$^2$ and an implant energy of about 5-10 KeV. The ion implantation process 60 may be performed before the patterned photoresist layer 110 is stripped off. After the ion implantation process 60 is completed, a rapid thermal annealing (RTA) or furnace annealing may be performed to activate the dopants in the $N^+$ doped region 101 for better Ohmic contact.

Figure 4:
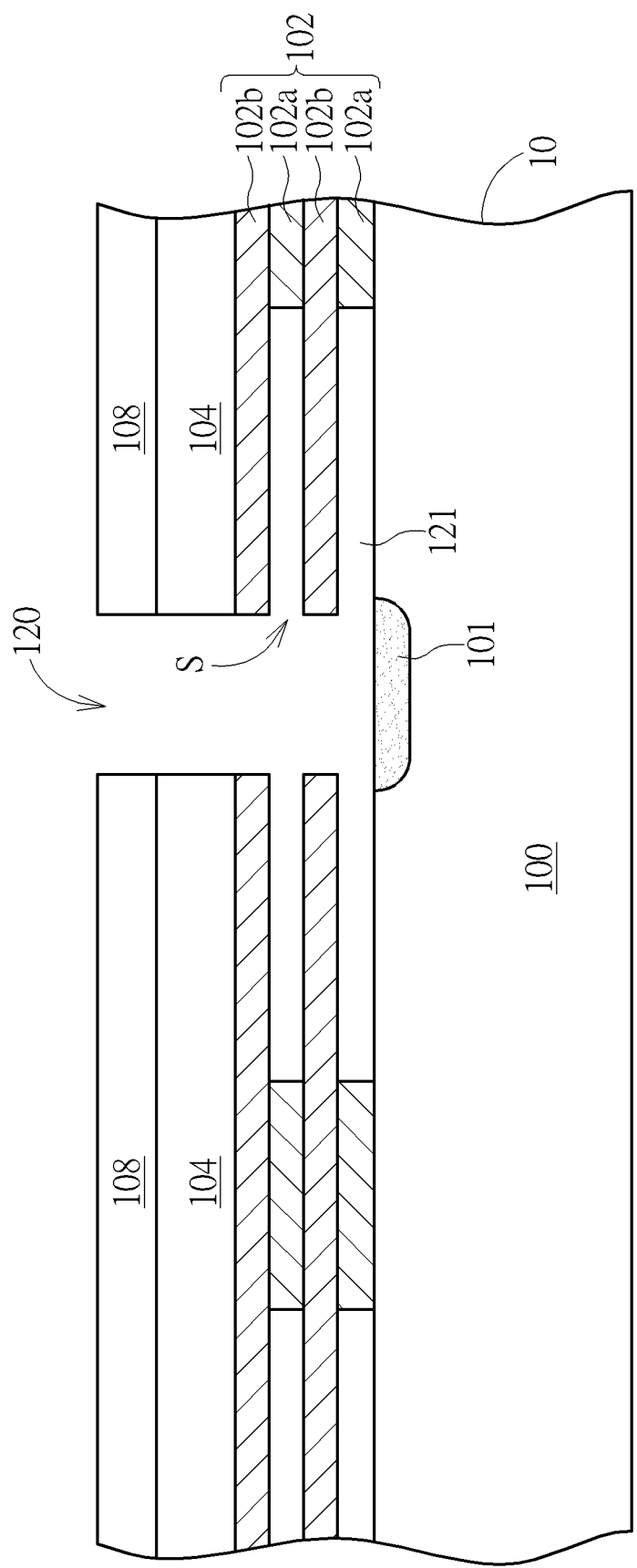

As shown in FIG. 4, an isotropic etching process such as a wet etching or chemical dry etch (CDE) is performed to selectively etch the silicon oxide layers 102a within the shallow capacitor cavity 120. The silicon oxide layers 102a is pulled back within the shallow capacitor cavity 120, while the silicon nitride layers 102b remain substantially intact, thereby forming recesses 121 and corrugated sidewall surface S on the sidewall of the shallow capacitor cavity 120. The span of the corrugated sidewall surface S is substantially commensurate with the entire thickness of the insulator layer 102 within the shallow capacitor cavity 120.

Figure 5:
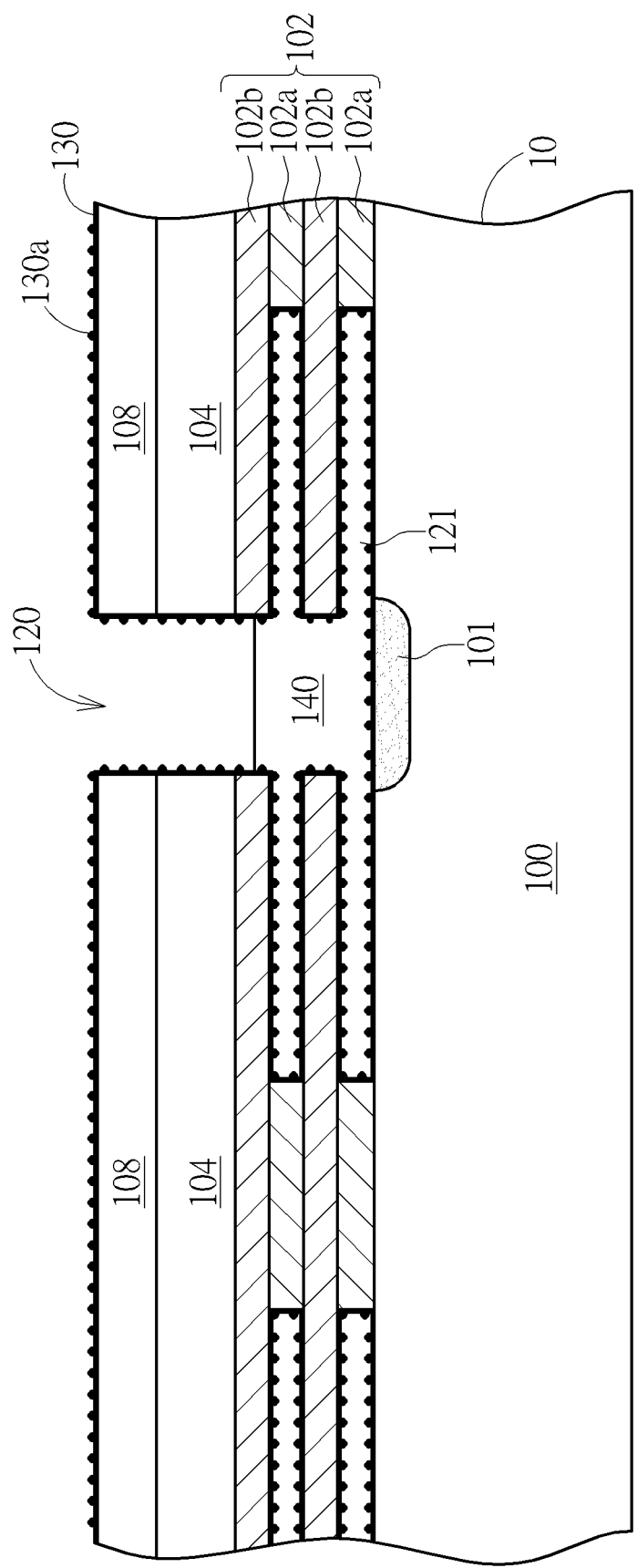

As shown in FIG. 5, a conductive material layer 130 is conformally formed on the silicon nitride layer 108 and on the interior surface of the shallow capacitor cavity 120 including the recesses 121. The conductive material layer 130 is in direct contact with the $N^+$ doped region 101. According to one embodiment, for example, the conductive material layer 130 may have a thickness of about 1-15 nm. According to one embodiment, for example, the conductive material layer 130 may comprise W, WSi, Ti, TiN, N-type polysilicon, or combinations thereof. According to one embodiment, preferably, the conductive material layer 130 may be an N-type polysilicon with rugged surface 130a. For example, the conductive material layer 130 may comprise an N-type hemispherical grained (HSG) silicon layer, but not limited thereto. According to one embodiment, for example, the conductive material layer 130 may by formed by CVD or atomic layer deposition (ALD) methods.

Subsequently, the shallow capacitor cavity 120 is filled with a sacrificial material layer 140. For example, the sacrificial material layer 140 may comprise a spin-on material or a photoresist layer or an organic planarization layer (OPL), but not limited thereto. According to one embodiment, for example, the sacrificial material layer 140 may be further subjected to a baking or curing process. An etching process is then performed to recess the sacrificial material layer 140 down to a horizontal level that is slightly lower than the interface between the silicon device layer 104 and the insulator layer 102. At this point, the lower portion of the shallow capacitor cavity 120 and the recesses 121 are filled with the sacrificial material layer 140 and the conductive material layer 130 above the top surface of the recessed sacrificial material layer 140 is exposed.

Figure 6:
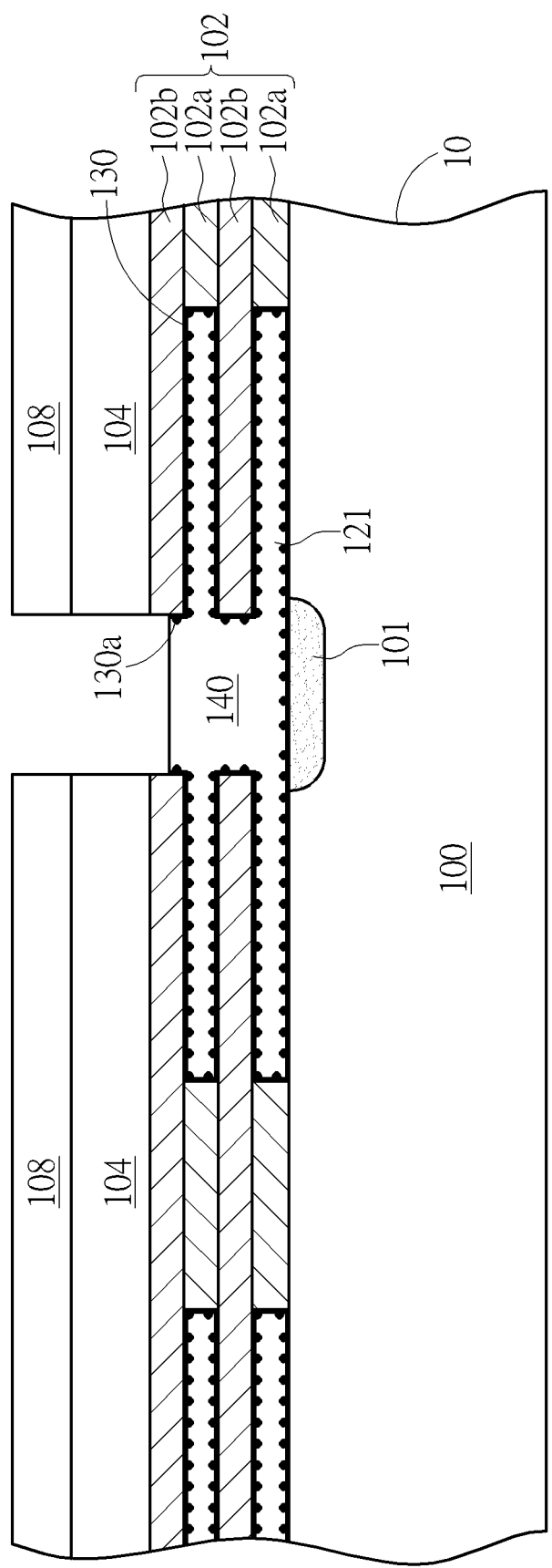

As shown in FIG. 6, an etching process such as an isotropic etching process including, but not limited to, wet chemical etch or CDE, is performed to remove the exposed conductive material layer 130 that is not covered by the recessed sacrificial material layer 140.

Figure 7:
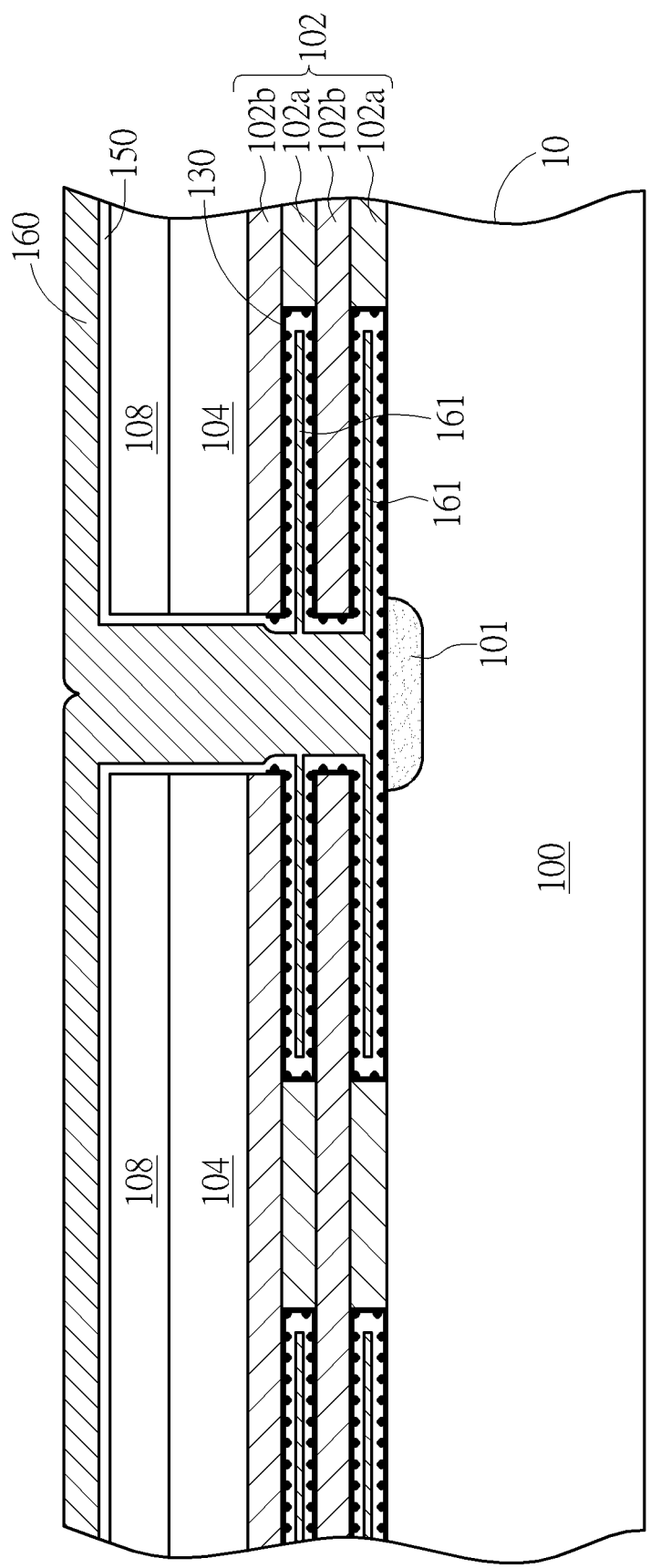

As shown in FIG. 7, the remaining sacrificial material layer 140 is completely removed from the shallow capacitor cavity 120. Thereafter, a capacitor dielectric layer 150 is conformally formed on the silicon nitride layer 108 and on the interior surface of the shallow capacitor cavity 120. The capacitor dielectric layer 150 covers the conductive material layer 130 within the shallow capacitor cavity 120 including the recesses 121. According to one embodiment, for example, the capacitor dielectric layer 150 may comprise silicon oxide, silicon nitride, or high-k dielectric known in the art. The capacitor dielectric layer 150 may be deposited by any suitable deposition methods such as CVD or ALD methods. According to one embodiment, for example, the capacitor dielectric layer 150 may have a thickness of about 1-10 nm. Subsequently, the remaining space within the shallow capacitor cavity 120 is filled up with a conductive material layer 160. According to one embodiment, for example, the conductive material layer 160 may have a thickness of about 150-500 nm. According to one embodiment, for example, the conductive material layer 160 may comprise W, WSi, Ti, TiN, N-type polysilicon, or combinations thereof. According to one embodiment, the conductive material layer 160 comprises fin-like electrodes 161 laterally extending into the recesses 121, respectively.

Figure 8:
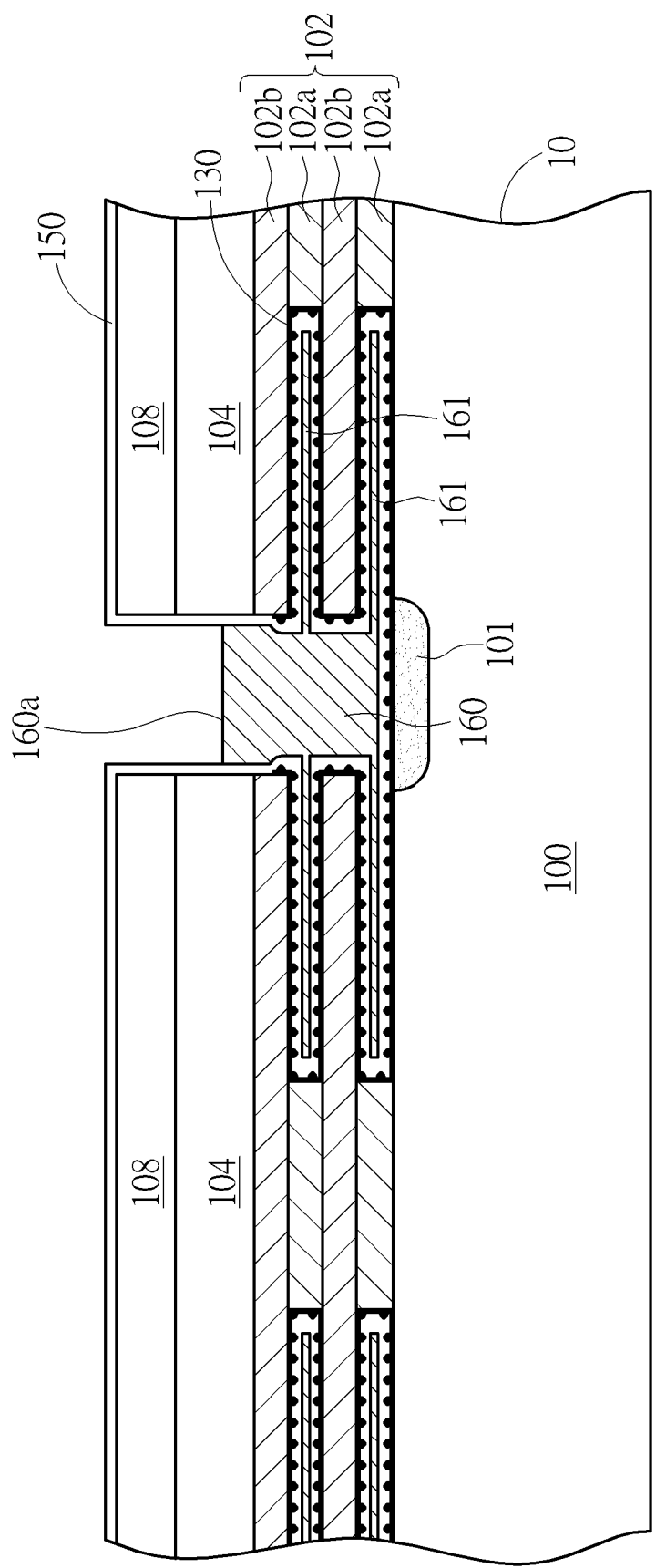

As shown in FIG. 8, optionally, a chemical mechanical polishing (CMP) process is then performed to planarize the top surface of the conductive material layer 160. After the CMP process, the conductive material layer 160 is etched back and recessed to a horizontal level that is somewhere between the upper surface and lower surface of the silicon device layer 104. At this point, the top surface 160a of the recessed conductive material layer 160 is disposed within the shallow capacitor cavity 120 and below the silicon nitride layer 108.

Figure 9:
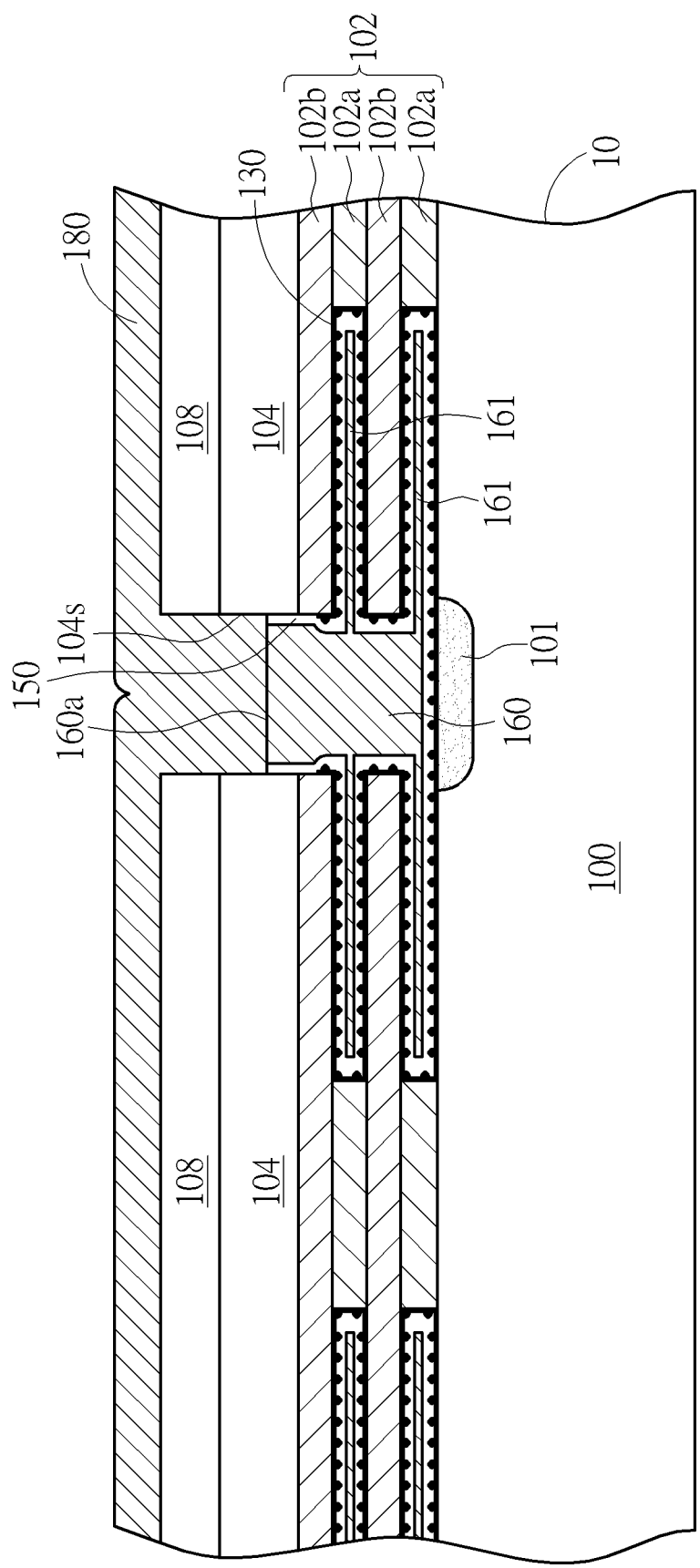

As shown in FIG. 9, after recessing the conductive material layer 160, the capacitor dielectric layer 150 that is not covered by the conductive material layer 160 is removed. An etching process such as an isotropic etching process including, but not limited to, wet chemical etch or CDE, may be performed to remove the capacitor dielectric layer 150.

Figure 10:
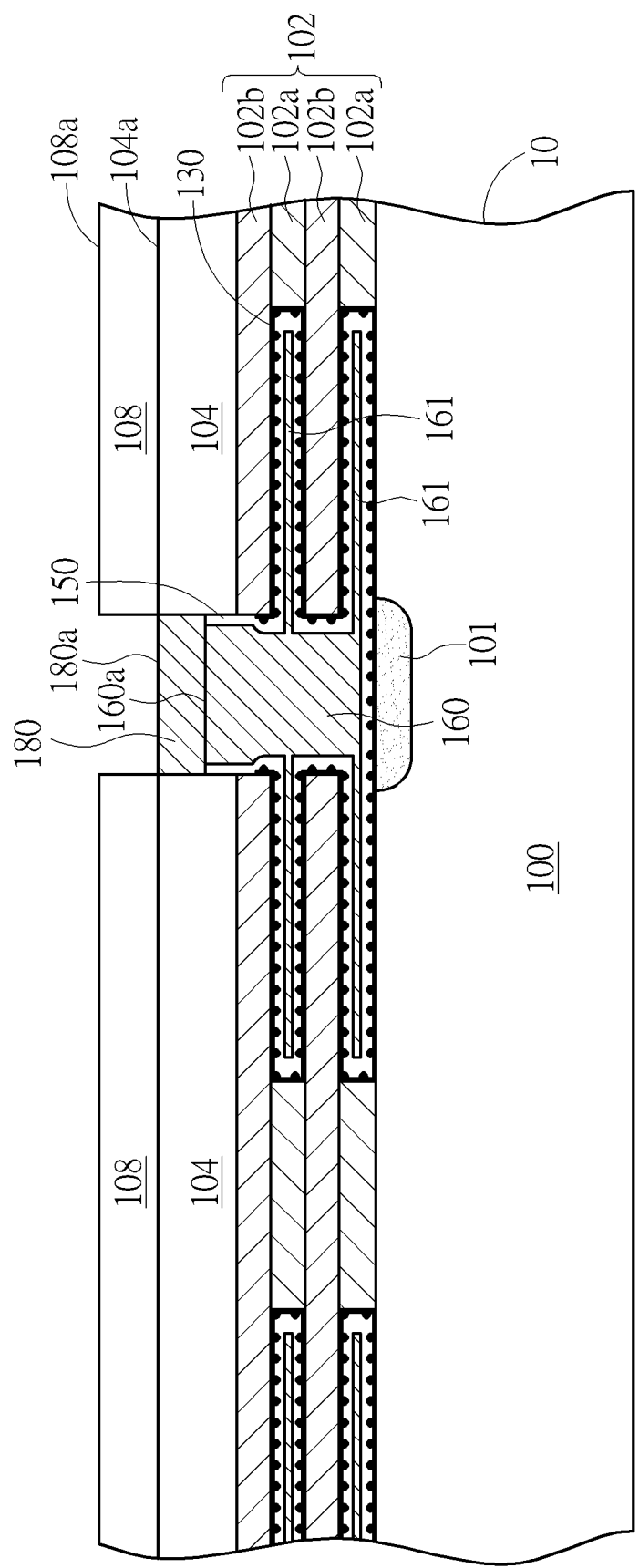

As shown in FIG. 10, a conductive material layer 180 is then deposited over the substrate 10 in a blanket manner. According to one embodiment, for example, the conductive material layer 160 of about 10-00 nm thick may comprise W, WSi, Ti, TiN, N-type polysilicon, or combinations thereof. The remaining space within the shallow capacitor cavity 120 above the top surface 160a of the recessed conductive material layer 160 is filled with the conductive material layer 180. According to one embodiment, the conductive layer 150 is in direct contact with the top surface 160a of the recessed conductive material layer 160 and in direct contact with the sidewall surface 104s of the silicon device layer 104.

As shown in FIG. 10, after the deposition of the conductive material layer 180, optionally, a planarization process may be performed to render the upper surface of the conductive material layer 180 within the shallow capacitor cavity 120 coplanar with the upper surface 106a of the pad oxide layer 106. According to one embodiment, for example, the planarization process may be a CMP process or an etch-back process. Subsequently, the conductive material layer 180 within the shallow capacitor cavity 120 is etched back and recessed within the shallow capacitor cavity 120 such that the upper surface 180a is lower than the upper surface 108a of the silicon nitride layer 108. At this point, the upper surface 180a of the conductive material layer 180 is substantially coplanar with the upper surface 104a of the silicon device layer 104.

Figure 11:
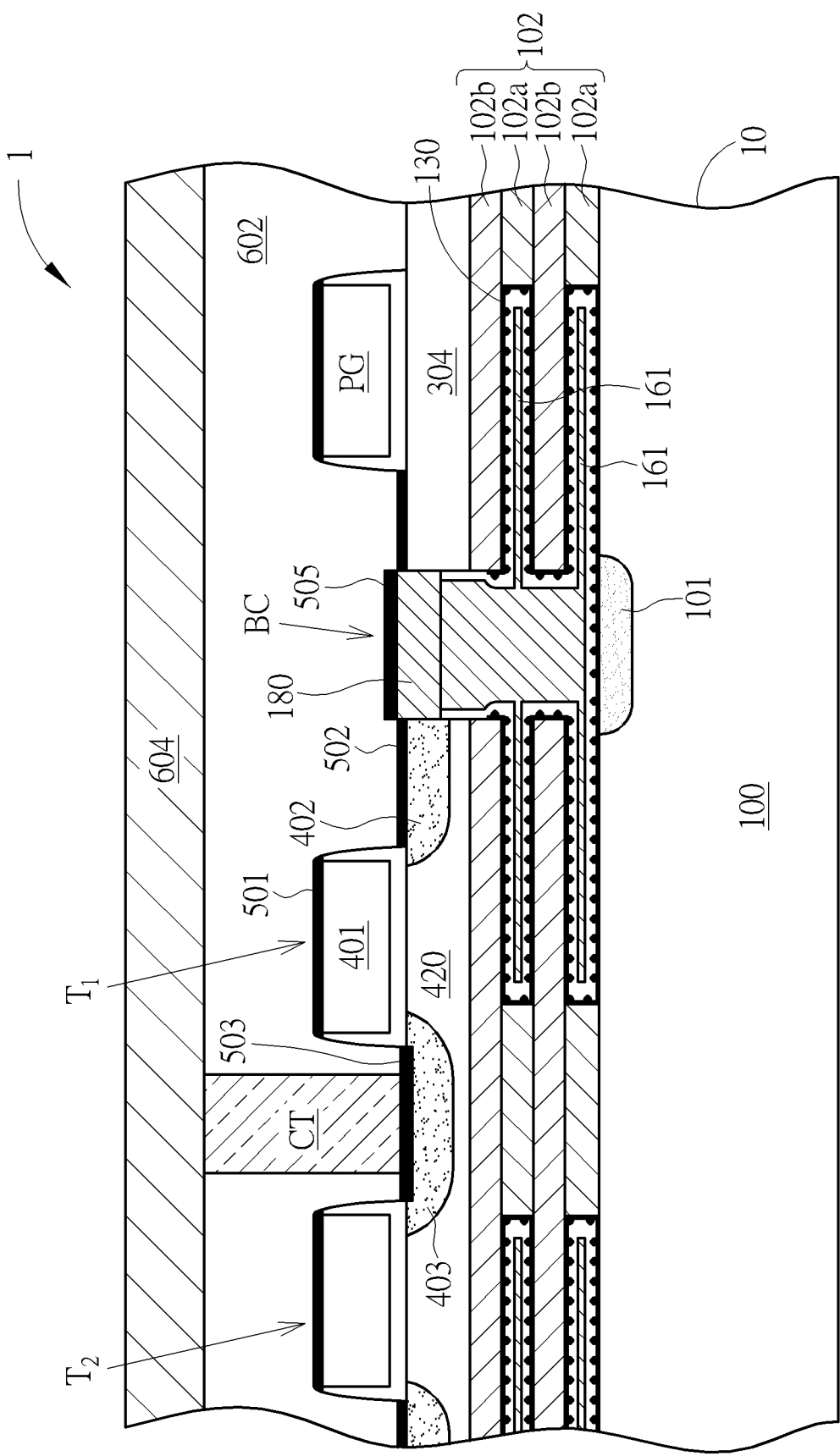

As shown in FIG. 11, after removing the conductive material layer 180 outside the shallow capacitor cavity 120, the silicon nitride layer 108 is then removed by using an isotropic etching process. After removing the silicon nitride layer 108, the upper surface 104a of the silicon device layer 104 is revealed. At this point, a buried capacitor BC is formed within the shallow capacitor cavity 120. The buried capacitor BC comprises the conductive material layer 160 that acts as an inner electrode, conductive material layer 130 that acts as an outer electrode, and the capacitor dielectric layer 150 between the conductive material layer 160 and the conductive material layer 130. The conductive material layer 180 buried in the shallow capacitor cavity 120 is situated atop the conductive material layer 160 and may function as a buried strap that electrically connects the conductive material layer 160 with the silicon device layer 104. The shallow capacitor cavity 120 including the recesses 121 increases the capacitor surface area without the need of increasing the trench depth as the geometry gets smaller and smaller. The shallower capacitor cavity also reduces the serial resistance and improves the device performance.

Subsequently, several fabrication processes for making semiconductor circuit elements on the silicon device layer 104 are performed to complete the formation of the semiconductor device 1. For example, a shallow trench isolation (STI) process is carried out to form STI region 304 in the silicon device layer 104 so as to define active areas of the silicon device layer 104, on which the semiconductor circuit elements such as metal-oxide-semiconductor (MOS) transistors $T_1$, $T_2$ are fabricated. The two exemplary MOS transistors $T_1$, $T_2$ may function as select transistors. Each of the two exemplary MOS transistors $T_1$, $T_2$ comprises a gate 401, an N-type source region 402, an N-type drain region 403, a gate oxide layer 410 under the gate 401. For example, the two exemplary mirror-symmetric MOS transistors $T_1$, $T_2$ share the N-type drain region 403. Silicide layers 501, 502, 503, and 505 may be formed on the gate 401, the N-type source region 402, the N-type drain region 403, and the conductive material layer 180, respectively. The N-type source region 402 is electrically connected to the conductive material layer 180. The silicide layer 505 on the conductive material layer 180 may be in direct contact with the silicide layer 502 on the N-type source region 402. According to one embodiment, for example, the silicide layers 501, 502, 503, 505 may comprise tungsten silicide ($WSi_x$), cobalt silicide ($CoSi_x$), nickel silicide ($NiSi_x$), or titanium silicide ($TiSi_x$), but not limited thereto.

It is understood that the two exemplary MOS transistors $T_1$, $T_2$ may be planar-type transistor or fin-type transistors. In some embodiments, the N-type source region 402 and the N-type drain region 403 may have the same depth that is greater than or equal to the total thickness of the silicon device layer 104.

According to one embodiment, a passing gate PG may be formed on the STI region 304. An inter-layer dielectric (ILD) layer 602 may be deposited in a blanket manner to cover the two exemplary MOS transistors $T_1$, $T_2$ and the passing gate PG. A contact plug CT may be formed in the ILD layer 602. The contact plug CT is electrically connected to the N-type drain region 403. For example, the contact plug CT may be a tungsten plug, but not limited thereto. A bit line 604 is formed on the ILD layer 602 and is electrically connected to the contact plug CT. The bit line 604 may be a metal line that is formed by metal interconnection processes. For example, the bit line 604 may be a damascened copper metal line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate comprising a semiconductor substrate, an insulator layer on said semiconductor substrate, and a silicon device layer on said insulator layer;
   forming at least one capacitor cavity with corrugated sidewall surface within said insulator layer between said semiconductor substrate and said silicon device layer;
   forming at least one buried capacitor in said at least one capacitor cavity, said at least one buried capacitor comprising inner and outer electrodes with a capacitor dielectric layer therebetween; and
   forming at least one transistor on said substrate, wherein said at least one transistor comprises a source region, a drain region, a channel region between said source region and said drain region, and a gate over said channel region, and wherein said source region is electrically connected to said inner electrode of said at least one buried capacitor.

2. The method according to claim 1 further comprising:
   forming alternating layers in said substrate to form said insulator layer.

3. The method according to claim 2, wherein said alternating layers comprise alternating silicon oxide layers and silicon nitride layers.

4. The method according to claim 3, wherein each of said silicon oxide layers has a thickness of about 2-20 nm and each of said silicon nitride layers has a thickness of about 2-20 nm.

5. The method according to claim 3 further comprising:
   forming recesses in said silicon oxide layers.

6. The method according to claim 5, wherein said inner electrode comprises fin-like electrodes laterally extending into said recesses, respectively.

7. The method according to claim 1, wherein said at least one capacitor cavity has a depth ranging between 200 and 1000 nm.

* * * * *